(12) United States Patent
Zampini et al.

(10) Patent No.: US 6,599,951 B2
(45) Date of Patent: Jul. 29, 2003

(54) ANTIREFLECTIVE POROGENS

(75) Inventors: Anthony Zampini, Westborough, MA (US); Michael K. Gallagher, Lansdale, PA (US)

(73) Assignee: Shipley Company, L.L.C., Marlborough, MA (US)

(*) Notice: Subject to any disclaimer, the term of this patent is extended or adjusted under 35 U.S.C. 154(b) by 0 days.

(21) Appl. No.: 10/154,504

(22) Filed: May 24, 2002

(65) Prior Publication Data

US 2002/0198269 A1 Dec. 26, 2002

Related U.S. Application Data

(62) Division of application No. 09/974,072, filed on Oct. 11, 2001.
(60) Provisional application No. 60/239,026, filed on Oct. 10, 2000.

(51) Int. Cl.⁷ .................... C08F 120/10; C08G 77/20
(52) U.S. Cl. .................... 521/50; 521/60; 521/64; 521/77; 528/32; 528/4.25
(58) Field of Search .................. 528/32, 425; 526/328; 521/60, 64, 77

(56) References Cited

U.S. PATENT DOCUMENTS

| | | |
|---|---|---|
| 4,362,809 A | 12/1982 | Chen et al. |
| 4,370,405 A | 1/1983 | O'Toole et al. |
| 4,910,122 A | 3/1990 | Arnold et al. |
| 5,700,844 A | 12/1997 | Hedrick et al. |
| 5,767,014 A | 6/1998 | Hawker et al. |
| 5,883,219 A | 3/1999 | Carter et al. |
| 5,895,263 A | 4/1999 | Carter et al. |
| 5,905,117 A | 5/1999 | Yokotsuka et al. |
| 6,093,636 A | 7/2000 | Carter et al. |
| 6,143,643 A | 11/2000 | Carter et al. |
| 6,146,749 A | 11/2000 | Miyamoto et al. |
| 6,162,838 A | 12/2000 | Kohl |
| 6,268,457 B1 | 7/2001 | Kennedy et al. |
| 6,271,273 B1 | 8/2001 | You et al. |
| 6,365,765 B1 | 4/2002 | Baldwin et al. |

FOREIGN PATENT DOCUMENTS

| | | |
|---|---|---|
| EP | 0 553 843 A2 | 8/1993 |
| EP | 1 088 848 A1 | 4/2001 |
| WO | WO 90/03598 | 4/1990 |
| WO | WO 93/22901 | 11/1993 |
| WO | WO 99/03926 | 1/1999 |
| WO | WO 00/68956 | 11/2000 |

OTHER PUBLICATIONS

SciFinder Abstract; Papir, Toram S.; Woods, Martin E.; Krieger, Irwin M.; "*Monodisperse latexes*, III. Crosslinked Polystyrene Latexes"; Case West Res. Univ., Cleveland, OH, USA. Journal of Paint Technology (1970), 42(550), 571–8, Coden: JPTYAX ISSN: 0094–8691, JOurnal written in English, CAN 74:32740 AN 1971:32740 CAPLUS (Copyright 2003 ACS), p. 2; Jan. 24, 2003.

Hedrick et al., "Templating Nanoporosity in Thin–Film Dielectric Insulators", Adv. Mater. 1998, 10, No. 13, pp. 1049–1053.

Remenar et al., "Templating Nanopores into Poly (methyl–silsesquioxane): New Low–Dielectric Coatings Suitable for Microelectronic Applications", Mat. Res. Soc. Symp. Proc. 511, pp. 69–75.

*Primary Examiner*—Morton Foelak
(74) *Attorney, Agent, or Firm*—S. Matthew Cairns

(57) ABSTRACT

Disclosed are organo polysilica dielectric materials having low dielectric constants useful in electronic component manufacture are disclosed along with methods of preparing the porous organo polysilica dielectric materials. Also disclosed are methods of forming electronic devices containing such porous organo polysilica dielectric materials without the use of antireflective coatings.

14 Claims, No Drawings

ANTIREFLECTIVE POROGENS

This patent application is a divisional of application Ser. No. 09/974,072, filed on Oct. 11, 2001 which claims the benefit of provisional application No. 60/239,026 filed on Oct. 10, 2000.

BACKGROUND OF THE INVENTION

This invention relates generally to the manufacture of electronic devices. In particular, this invention relates to the manufacture of electronic devices having antireflective dielectric layers.

As electronic devices become smaller, there is a continuing desire in the electronics industry to increase the circuit density in electronic components, e.g., integrated circuits, circuit boards, multichip modules, chip test devices, and the like without degrading electrical performance, e.g., crosstalk or capacitive coupling, and also to increase the speed of signal propagation in these components. One method of accomplishing these goals is to reduce the dielectric constant of the interlayer, or intermetal, insulating material used in the components.

A variety of organic and inorganic porous dielectric materials are known in the art in the manufacture of electronic devices, particularly integrated circuits. Suitable inorganic dielectric materials include silicon dioxide and organo polysilicas. Suitable organic dielectric materials include thermosets such as polyimides, polyarylene ethers, polyarylenes, polycyanurates, polybenzazoles, benzocyclobutenes and the like. Of the inorganic dielectrics, the alkyl silsesquioxanes such as methyl silsesquioxane are of increasing importance because of their lower dielectric constant.

A method for reducing the dielectric constant of interlayer, or intermetal, insulating material is to incorporate within the insulating film very small, uniformly dispersed pores or voids. In general, such porous dielectric materials are prepared by first incorporating a removable porogen into a B-staged dielectric material, disposing the B-staged dielectric material containing the removable porogen onto a substrate, curing the B-staged dielectric material and then removing the porogen to form a porous dielectric material. For example, U.S. Pat. No. 5,895,263 (Carter et al.) discloses a process for forming an integrated circuit containing porous organo polysilica dielectric material. U.S. Pat. No. 6,093,636 (Carter et al.) discloses a process for forming an integrated circuit containing porous thermoset dielectric material. Copending U.S. patent application Ser. No. 09/460,326 (Allen et al.), discloses porogen particles that are substantially compatibilized with B-staged dielectric matrix materials and methods of preparing electronic devices using such porogens.

After the porous dielectric material is formed, it is subjected to conventional processing conditions of patterning, etching apertures, optionally applying a barrier layer and/or seed layer, metallizing or filling the apertures, planarizing the metallized layer, and then applying a cap layer or etch stop. These process steps may then be repeated to form another layer of the device.

Dielectric layers are patterned using photoresists. Photoresists are photosensitive films used for transfer of an image to a substrate. A coating layer of a photoresist is formed on a substrate, such as a dielectric layer, and the photoresist layer is then exposed through a photomask (reticle) to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or cross-link in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are known to the art and described by Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4, both incorporated herein by reference to the extent they teach photoresist compositions and methods of making and using them.

In the manufacture of electronic devices, reflection of actinic radiation during exposure of the photoresist is detrimental to fine feature formation. Reflection of actinic radiation, such as from the layer underlying the photoresist, often poses limits on resolution of the image patterned in the photoresist layer. Reflection of radiation from the substrate/photoresist interface can produce variations in the radiation intensity in the photoresist during exposure, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity.

Reflection of activating radiation also contributes to what is known in the art as the "standing wave effect." To eliminate the effects of chromatic aberration in exposure equipment lenses, monochromatic or quasi-monochromatic radiation is commonly used in photoresist projection techniques. Due to radiation reflection at the photoresist/substrate interface, however, constructive and destructive interference is particularly significant when monochromatic or quasi-monochromatic radiation is used for photoresist exposure. In such cases the reflected light interferes with the incident light to form standing waves within the photoresist. In the case of highly reflective substrate regions, the problem is exacerbated since large amplitude standing waves create thin layers of underexposed photoresist at the wave minima. The underexposed layers can prevent complete photoresist development causing edge acuity problems in the photoresist profile. The time required to expose the photoresist is generally an increasing function of photoresist thickness because of the increased total amount of radiation required to expose an increased amount of photoresist. However, because of the standing wave effect, the time of exposure also includes a harmonic component which varies between successive maximum and minimum values with the photoresist thickness. If the photoresist thickness is non-uniform, the problem becomes more severe, resulting in variable linewidths.

With recent trends towards high-density semiconductor devices, there is a movement in the industry to shorten the wavelength of exposure sources to deep ultraviolet (DUV) light (300 nm or less in wavelength), KrF excimer laser light (248 nm), ArF excimer laser light (193 nm), electron beams and soft x-rays. The use of shortened wavelengths of light for imaging a photoresist coating has generally resulted in increased reflection from the upper resist surface as well as the surface of the underlying substrate, thus exacerbating the problems of reflection from a substrate surface.

Radiation reflection problems have been addressed by a variety of means, such as the addition of certain dyes to photoresist compositions, the dyes absorbing radiation at or near the wavelength used to expose the photoresist. Conventionally, a radiation absorbing layer either interposed between the substrate surface and the photoresist coating layer, called a bottom antireflective coating or BARC, or a radiation layer disposed on the surface of the photoresist layer, called a top antireflective coating or TARC, is used to reduce the problem of reflection of actinic radiation. See, for example, PCT Application WO 90/03598, EPO Application No. 0 639 941 A1 and U.S. Pat. Nos. 4,910,122, 4,370,405 and 4,362,809. Such BARC and TARC layers have been generally referred to in the literature as antireflective layers or antireflective compositions.

Conventional antireflective compositions include a radiation absorbing component (or chromophore), a polymeric binder and optionally a cross-linking agent. The polymeric binders are typically linear polymers having relatively low molecular weights, such as up to 20,000 Daltons. Such polymeric binders have been used as they tend to form coatings of uniform thickness, form planarized coating layers and can be easily dispensed onto a substrate for lithographic processing. The etch rates of antireflective coatings should be equal to or faster than the etch rate of the photoresist used in order to prevent undercutting. However, it is often difficult to substantially match the etch rates of the antireflective coating material to the photoresist while still providing a sufficiently absorbing coating.

Thus, to pattern each dielectric layer of an electronic device in a conventional process, an antireflective coating layer (typically 600 to 2000 Å thick) and a photoresist layer are used. Such two layers require two dispensing steps, two or more distinct baking steps, twice the amount of organic solvent as compared to the use of only one such layer, and significantly add to the time for manufacturing an electronic device.

There is thus a need in the manufacture of electronic devices for providing imaged dielectric layers using fewer process steps and less organic solvent, while still reducing the effects of reflection of actinic radiation.

SUMMARY OF THE INVENTION

It has now been surprisingly found that dielectric materials may be made antireflective, thus eliminating or reducing the use of separate antireflective coatings. The process time to manufacture electronic devices can be reduced and the use of organic solvents in such processes can also be reduced. According to the present invention, the problems of matching the etch rates of the antireflective coatings with the photoresist is thus reduced or eliminated.

In a first aspect, the present invention is directed to compositions useful for forming porous organo polysilica dielectric material including removable porogen, wherein the porogen includes one or more chromophores.

In a second aspect, the present invention is directed to a composition including a B-staged organo polysilica dielectric material and a porogen, wherein the porogen includes one or more chromophores.

In a third aspect, the present invention is directed to a method of manufacturing an electronic device including the steps of; a) disposing on the substrate a B-staged organo polysilica dielectric material including porogen; b) curing the B-staged organo polysilica dielectric material to form an organo polysilica dielectric matrix material without substantially degrading the porogen; and c) thereafter subjecting the organo polysilica dielectric matrix material to conditions which at least partially remove the porogen to form a porous organo polysilica dielectric material without substantially degrading the organo polysilica dielectric material; wherein the porogen includes one or more chromophores.

In a fourth aspect, the present invention is directed to a method of manufacturing an electronic device including the steps of: a) disposing on the substrate a B-staged organo polysilica dielectric material including porogen; b) curing the B-staged organo polysilica dielectric material to form an organo polysilica dielectric matrix material without substantially degrading the porogen; c) disposing a photoresist on the organo polysilica dielectric matrix material; d) exposing the photoresist; and e) thereafter subjecting the organo polysilica dielectric matrix material to conditions which at least partially remove the porogen to form a porous organo polysilica dielectric material without substantially degrading the organo polysilica dielectric material; wherein the porogen includes one or more chromophores.

In a fifth aspect, the present invention is directed to a method of preparing porous organo polysilica dielectric materials including the steps of: a) disposing removable porogen in a B-staged organo polysilica dielectric material; b) curing the B-staged organo polysilica dielectric material to form an organo polysilica dielectric matrix material without substantially degrading the porogen; and c) subjecting the organo polysilica dielectric matrix material to conditions which at least partially remove the porogen to form a porous organo polysilica dielectric material without substantially degrading the organo polysilica dielectric material; wherein the porogen includes one or more chromophores.

In a sixth aspect, the present invention is directed to an electronic device including a layer of organo polysilica dielectric material including porogen wherein the porogen includes one or more chromophores.

In a seventh aspect, the present invention is directed to a method of manufacturing an electronic device including the step of forming a relief image on an organo polysilica dielectric material, wherein the relief image is formed without the use of a separate antireflective coating layer.

In an eighth aspect, the present invention is directed to an electronic device prepared according to the methods described above.

DETAILED DESCRIPTION OF THE INVENTION

As used throughout this specification, the following abbreviations shall have the following meanings, unless the context clearly indicates otherwise: ° C.=degrees centigrade; $\mu$m =micron; UV=ultraviolet; nm=nanometer; $\mu$m=micron= micrometers; wt %=weight percent; MAPS=MATS= (trimethoxylsilyl)propylmethacrylate; HA=hexyl acrylate; TMPTMA=trimethylolpropane trimethacrylate; PPGMEA260=poly(propylene glycol) methyl ether acrylate having a molecular weight of about 260; PEGMEMA475= poly(ethylene glycol) methyl ether methacrylate having a molecular weight of about 475; VTMS= vinyltrimethylsilane; VTMOS=vinyltrimethoxysilane;

BA=butyl acrylate; ANTMA=anthrecenyl methacrylate; DVB=divinylbenzene; TFE=tetrafluoroethylene; and HPMA=hydroxypropyl methyacrylate.

The term "(meth)acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. The terms "halogen" and "halo" refer to fluorine, chlorine, bromine and iodine. Thus, the term "halogenated" refers to fluorinated, chlorinated, brominated and iodinated. "Fluoroalkyl" refers to both partially fluorinated and perfluorinated alkyl. The term "porogen" refers to a pore forming material, such as, but not limited to a polymeric material or particle, dispersed in a dielectric material that is subsequently removed to yield pores, voids or free volume in the dielectric material. Thus, the terms "removable porogen," "removable polymer" and "removable particle" are used interchangeably throughout this specification. The terms "pore," "void" and "free volume" are used interchangeably throughout this specification. "Cross-linker" and "cross-linking agent" are used interchangeably throughout this specification. "Polymer" refers to polymers and oligomers. The term "polymer" also includes homopolymers and copolymers. The terms "oligomer" and "oligomeric" refer to dimers, trimers, tetramers and the like. "Monomer" refers to any ethylenically or acetylenically unsaturated compound capable of being polymerized. Such monomers may contain one or more double or triple bonds.

The term "B-staged" refers to uncured organo polysilica dielectric matrix materials. By "uncured" is meant any organo polysilica material that can be polymerized or cured, such as by condensation, to form higher molecular weight materials, such as coatings or films. Such B-staged material may be monomeric, oligomeric or mixtures thereof. B-staged material is further intended to include mixtures of polymeric material with monomers, oligomers or a mixture of monomers and oligomers.

Unless otherwise noted, all amounts are percent by weight and all ratios are by weight. All numerical ranges are inclusive and combinable.

The present invention relates to the synthesis, composition, size, distribution and purity of materials useful as removable porogens, i.e., pore forming material, for organo polysilica dielectric materials. Such porogens are useful for forming porous organo polysilica dielectric materials in the fabrication of electronic devices including optoelectronic devices. Such porogens have the advantage that they contain one or more chromophores, thereby reducing or eliminating the need for a separate antireflective coating in the process of patterning or forming a relief image in such dielectric material. Thus, the present invention provides porogens useful for forming porous organo polysilica dielectric material, wherein the porogen includes one or more chromophores. Such organo polysilica dielectric materials, prior to removal of the porogen, are self-antireflective, meaning that the porogen containing dielectric material functions as an antireflective coating without the need for a separate antireflective coating layer.

The porogens of the present invention are useful in reducing the dielectric constant of organo polysilica dielectric materials, particularly those materials having low dielectric constants ("k"). A low-k dielectric material is any material having a dielectric constant less than about 4. By B-staged organo polysilica (or organo siloxane) is meant a compound including silicon, carbon, oxygen and hydrogen atoms and having the formula:

$$((RR^1SiO)_a(R^2SiO_{1.5})_b(R^3SiO_{1.5})_c(SiO_2)_d)_n$$

wherein R, $R^1$, $R^2$ and $R^3$ are independently selected from hydrogen, ($C_1$–$C_6$)alkyl, aryl, and substituted aryl; a, c and d are independently a number from 0 to 1; b is a number from 0.2 to 1; n is integer from about 3 to about 10,000; provided that a+b+c+d=1; and provided that at least one of R, $R^1$ and $R^2$ is not hydrogen. "Substituted aryl" refers to an aryl group having one or more of its hydrogens replaced by another substituent group, such as cyano, hydroxy, mercapto, halo, ($C_1$–$C_6$)alkyl, ($C_1$–$C_6$)alkoxy, and the like. In the above formula, a, b, c and d represent the mole ratios of each component. Such mole ratios can be varied between 0 and about 1. It is preferred that a is from 0 to about 0.8. It is also preferred that c is from 0 to about 0.8. It is further preferred that d is from 0 to about 0.8. In the above formula, n refers to the number of repeat units in the B-staged material. Preferably, n is an integer from about 3 to about 1000. It will be appreciated that prior to any curing step, the B-staged organo polysilica dielectric matrix materials may include one or more of hydroxyl or alkoxy end capping or side chain functional groups. Such end capping or side chain functional groups are known to those skilled in the art.

Suitable organo polysilica dielectric matrix materials include, but are not limited to, silsesquioxanes, partially condensed halosilanes or alkoxysilanes such as partially condensed by controlled hydrolysis tetraethoxysilane having number average molecular weight of about 500 to about 20,000, organically modified silicates having the composition $RSiO_3$ or $R_2SiO_2$ wherein R is an organic substituent, and partially condensed orthosilicates having $Si(OR)_4$ as the monomer unit. Silsesquioxanes are polymeric silicate materials of the type $RSiO_{1.5}$ where R is an organic substituent. Suitable silsesquioxanes are alkyl silsesquioxanes such as methyl silsesquioxane, ethyl silsesquioxane, propyl silsesquioxane, butyl silsesquioxane and the like; aryl silsesquioxanes such as phenyl silsesquioxane and tolyl silsesquioxane; alkyl/aryl silsesquioxane mixtures such as a mixture of methyl silsesquioxane and phenyl silsesquioxane; and mixtures of alkyl silsesquioxanes such as methyl silsesquioxane and ethyl silsesquioxane. B-staged silsesquioxane materials include homopolymers of silsesquioxanes, copolymers of silsesquioxanes or mixtures thereof. Such dielectric materials are generally commercially available or may be prepared by known methods.

It is preferred that the organo polysilica is a silsesquioxane, and more preferably methyl silsesquioxane, ethyl silsesquioxane, propyl silsesquioxane, iso-butyl silsesquioxane, tert-butyl silsesquioxane, phenyl silsesquioxane or mixtures thereof. Particularly useful silsesquioxanes include mixtures of hydrido silsesquioxanes with alkyl, aryl or alkyl/aryl silsesquioxanes. Typically, the silsesquioxanes useful in the present invention are used as oligomeric materials, generally having from about 3 to about 10,000 repeating units.

It will be appreciated that a mixture of dielectric materials may be used, such as two or more organo polysilica dielectric materials or a mixture of an organo polysilica dielectric matrix material with one or more other dielectric matrix materials, i.e. not an organo polysilica dielectric matrix material. Suitable other dielectric matrix materials include, but are not limited to, inorganic matrix materials such as carbides, oxides, nitrides and oxyfluorides of silicon, boron, or aluminum; and organic matrix materials such as benzocyclobutenes, poly(aryl esters), poly(ether ketones), polycarbonates, polyimides, fluorinated polyimides, polynorbornenes, poly(arylene ethers), polyaromatic hydrocarbons, such as polynaphthalene, polyquinoxalines, poly(perfluorinated hydrocarbons) such as poly(tetrafluoroethylene), and polybenzoxazoles.

It is preferred that when a mixture of an organo polysilica dielectric matrix material and another dielectric matrix material is used, the organo polysilica dielectric matrix material is present as a predominant component. It is further preferred that the organo polysilica dielectric matrix material in such admixtures is methyl silsesquioxane, phenyl silsesquioxane or mixtures thereof.

The porogens useful in the present invention are any which may be removed providing voids, pores or free volume in the dielectric material chosen and reduce the dielectric constant of such material, particularly those dielectric materials having low dielectric constants ("k"). A low-k dielectric material is any material having a dielectric constant less than about 4.

The removable porogens useful in the present invention are not substantially removed under the processing conditions used to cure the B-staged dielectric material or pattern the dielectric material. The present porogens are also removed under conditions which do not substantially degrade or otherwise adversely affect the dielectric material.

A wide variety of removable porogens may be used in the present invention. The removable porogens may be polymers such as polymeric particles, or may be monomers or polymers that are co-polymerized with a dielectric monomer to form a block copolymer having a labile (removable) component. In an alternative embodiment, the porogen may be pre-polymerized with the dielectric monomer to form the B-staged dielectric material which may be monomeric, oligomeric or polymeric. Such pre-polymerized B-staged material is then cured to form a dielectric layer. It is preferred that the porogen is polymeric, and more preferably a polymeric particle. "Polymer particles" or "polymeric particles" are well known to those skilled in the art and refer to a wide variety of hyperbranched polymeric materials, such as, but not limited to, particles, nanoparticles, nanogels, core-shell particles, and the like. Preferred polymeric particles are nanoparticles and nanogels. The polymeric particles may have a variety of morphologies, including single-lobed such as spherical, substantially spherical, cigar-shaped, rod-shaped and moon-shaped, and multilobed such as tetrahedral, raspberry, acorn, dumb-bell and the like. The particles useful in the present invention may also have a variety of structures such as uniform or core-shell such as egg-shell, egg-white and egg-yolk. Although linear polymer and dendrimer porogens may be useful in certain applications, it is preferred that "polymer particles" do not include linear polymers or dendrimer polymers.

Preferably, the removable porogen is substantially non-aggregated or non-agglomerated in the B-staged dielectric material. Such non-aggregation or non-agglomeration reduces or avoids the problem of killer pore or channel formation in the dielectric matrix. It is preferred that the removable porogen is a porogen particle or is co-polymerized with the dielectric monomer, and more preferably a porogen particle. It is further preferred that the porogen particle is substantially compatible with the B-staged dielectric matrix material. By "substantially compatible" is meant that a composition of B-staged dielectric material and porogen is slightly cloudy or slightly opaque upon visual inspection. Preferably, "substantially compatible" means at least one of a solution of B-staged dielectric material and porogen, a film or layer including a composition of B-staged dielectric material and porogen, a composition including a dielectric matrix material having porogen dispersed therein, and the resulting porous dielectric material after removal of the porogen is slightly cloudy or slightly opaque. To be compatible, the porogen must be soluble or miscible in the B-staged dielectric material, in the solvent used to dissolve the B-staged dielectric material or both. Suitable compatibilized porogens are those disclosed in co-pending U.S. patent applications Ser. Nos. 09/460,326 (Allen et al.) and 09/616,851 (You et al.). Other suitable removable particles are those disclosed in U.S. Pat. No. 5,700,844.

Compatibilized polymeric porogens include as polymerized units at least one compound selected from silyl containing monomers or poly(alkylene oxide) monomers. Such silyl containing monomers or poly(alkylene oxide) monomers may be used to form the uncrosslinked polymer, used as the crosslinker, or both. Any monomer containing silicon may be useful as the silyl containing monomers in the present invention. The silicon moiety in such silyl containing monomers may be reactive or unreactive. Exemplary "reactive" silyl containing monomers include those containing one or more alkoxy or acetoxy groups, such as, but not limited to, trimethoxysilyl containing monomers, triethoxysilyl containing monomers, methyl dimethoxysilyl containing monomers, and the like. Exemplary "unreactive" silyl containing monomers include those containing alkyl groups, aryl groups, alkenyl groups or mixtures thereof, such as but are not limited to, trimethylsilyl containing monomers, triethylsilyl containing monomers, phenyldimethylsilyl containing monomers, and the like. Polymeric porogens including silyl containing monomers as polymerized units are intended to include such porogens prepared by the polymerization of a monomer containing a silyl moiety. It is not intended to include a linear polymer that contains a silyl moiety only as end capping units.

Suitable silyl containing monomers include, but are not limited to, vinyltrimethylsilane, vinyltriethylsilane, vinyltrimethoxysilane, vinyltriethoxysilane, γ-trimethoxysilylpropyl (meth)acrylate, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), allyloxy-tert-butyldimethylsilane, allyloxytrimethylsilane, allyltriethoxysilane, allyltri-iso-propylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis(trimethylsilyloxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane and mixtures thereof.

The amount of silyl containing monomer useful to form the porogens of the present invention is typically from about 1 to about 99% wt, based on the total weight of the monomers used. It is preferred that the silyl containing monomers are present in an amount of from 1 to about 80% wt, and more preferably from about 5 to about 75% wt.

Suitable poly(alkylene oxide) monomers include, but are not limited to, poly(propylene oxide) monomers, poly(ethylene oxide) monomers, poly(ethylene oxide/propylene oxide) monomers, poly(propylene glycol) (meth)acrylates, poly(propylene glycol) alkyl ether (meth)acrylates, poly (propylene glycol) phenyl ether (meth)acrylates, poly (propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylene/ethylene glycol) alkyl ether (meth)acrylates and mixtures thereof. Preferred poly (alkylene oxide) monomers include trimethoylolpropane ethoxylate tri(meth)acrylate, trimethoylolpropane propoxylate tri(meth)acrylate, poly(propylene glycol) methyl ether acrylate, and the like. Particularly suitable poly(propylene glycol) methyl ether acrylate monomers are those having a molecular weight in the range of from about 200 to about 2000. The poly(ethylene oxide/propylene oxide) monomers useful in the present invention may be linear, block or graft copolymers. Such monomers typically have a degree of polymerization of from about 1 to about 50, and preferably from about 2 to about 50.

Typically, the amount of poly(alkylene oxide) monomers useful in the porogens of the present invention is from about 1 to about 99% wt, based on the total weight of the monomers used. The amount of poly(alkylene oxide) monomers is preferably from about 2 to about 90% wt, and more preferably from about 5 to about 80% wt.

The silyl containing monomers and the poly(alkylene oxide) monomers may be used individually or in combination to form compatibilized porogens according to the present invention. It is preferred that the silyl containing monomers and the poly(alkylene oxide) monomers are used in combination. In general, the amount of the silyl containing monomers or the poly(alkylene oxide) monomers needed to compatiblize the porogen with the dielectric matrix depends upon the level of porogen loading desired in the matrix, the particular composition of the organo polysilica dielectric matrix, and the composition of the porogen polymer. When a combination of silyl containing monomers and the poly(alkylene oxide) monomers is used, the amount of one monomer may be decreased as the amount of the other monomer is increased. Thus, as the amount of the silyl containing monomer is increased in the combination, the amount of the poly(alkylene oxide) monomer in the combination may be decreased.

To function as antireflective compositions, the present porogens contain one or more chromophores. As used herein, "chromophore" refers to a group that absorbs and/or attenuates the desired wavelength of the radiation used to image the photoresist.

It is preferred that the present porogens are polymeric. It is further preferred that the porogens include as polymerized units one or more monomers containing one or more chromophores. Such monomers may be used to form the uncross-linked polymer, used as the cross-linker or both.

For example, when the organo polysilica dielectric materials of the present invention are to be imaged with photoresists at radiation wavelengths such as 248 or 193 nm, the porogens may contain as the chromophore any aromatic or substituted aromatic moieties. Suitable aromatic monomers include, but are not limited to, those containing phenyl, substituted phenyl, naphthyl, substituted naphthyl, anthracenyl, substituted anthracenyl, phenanthrenyl, substituted phenanthrenyl, and the like. "Substituted aromatic" refers to aromatic groups having one or more of their hydrogens replaced with one or more other substituent groups, such as $(C_1-C_{12})$alkyl, halo, cyano, $(C_1-C_6)$alkoxy, and the like. Suitable anthrancenyl monomers are disclosed in U.S. Pat. No. 5,851,730 (Thackery et al.). Particularly useful chromophore containing monomers are those of formula I

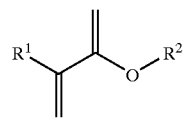

wherein $R^1$ is H or $CH_3$; and $R^2$ is selected from phenyl, benzyl,

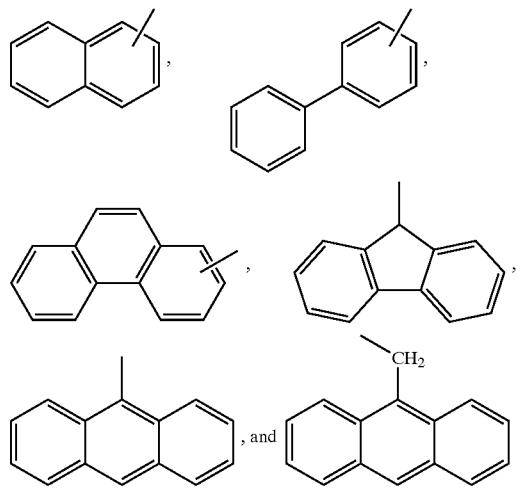

When organo polysilica dielectric material is to be imaged with photoresists at short wavelengths such as 157 nm or below, any monomer containing one or more $(C_4-C_{24})$alkyl groups is suitable as the chromophore. Particularly useful chromophore containing monomers include $(C_4-C_{24})$alkyl (meth)acrylates such as butyl (meth)acrylate, hexyl (meth) acrylate, octyl (meth)acrylate, nonyl (meth)acrylate, decyl (meth)acrylate, dodecyl (meth)acrylate, the "high cut" alkyl (meth)acrylates such as hexadecyl (meth)acrylate and octadecyl (meth)acrylate, and the like.

It will be appreciated by those skilled in the art that the absorption or attenuation of the present antireflective porogens may be increased by increasing the amount of such chromophores in the porogens. Typically, the chromophore moiety is present in the antireflective porogens in an amount of from 1 to 99% by weight, based on the total weight of the porogen. Preferably, the chromophore moiety is present in an amount of from 5 to 80% by weight and more preferably from 10 to 60% by weight.

One or more ethylenically unsaturated monomers, acetylenically unsaturated monomers or mixtures thereof may be copolymerized with the one or more monomers including chromophores to prepare the present antireflective porogens. Such ethylenically or acetylenically unsaturated monomers or mixtures thereof may be present as polymerized units in the polymers of the present invention in an amount in the range of 1 to 99 percent by weight, based on the total weight of the monomers, preferably from 10 to 95 percent by weight, more preferably from 20 to 90 percent by weight, and even more preferably from 60 to 90 percent by weight. It is further preferred that the antireflective porogens are crosslinked. Preferred antireflective porogens contain as polymerized units, one or more monomers including a chromophore, one or more additional monomers and one or more cross-linking agents. It is further preferred that the antireflective porogens contain as polymerized units, one or more monomers including a chromophore, at least one monomer selected from silyl containing monomers or poly (alkylene oxide) monomers, and one or more cross-linking agents.

The present antireflective porogens are removable from the organo polysilica dielectric material, such as by the unzipping of the polymer chains to the original monomer units which are volatile and diffuse readily through the host matrix, i.e. dielectric, material. By "removable" is meant that the polymer porogen or labile unit of a block copolymer with the dielectric matrix depolymerizes, degrades or otherwise breaks down into volatile components which can then diffuse through the host dielectric matrix film. Suitable monomers which may be copolymerized with the one or more chromophore containing monomers include, but are not limited to: (meth)acrylic acid, (meth)acrylamides, alkyl (meth)acrylates, alkenyl (meth)acrylates, aromatic (meth) acrylates, vinyl aromatic monomers, nitrogen-containing compounds and their thio-analogs, substituted ethylene monomers and fluorinated monomers.

Typically, the alkyl (meth)acrylates useful in the present invention are ($C_1$–$C_{24}$) alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy ($C_2$–$C_6$)alkyl (meth)acrylates, dialkylamino ($C_2$–$C_6$)-alkyl (meth)acrylates, dialkylamino($C_2$–$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or "HPMA."

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri ($C_1$–$C_6$)alkylsilyl (meth)acrylate, γ-propyl di($C_1$–$C_6$)alkoxy ($C_1$–$C_6$)alkylsilyl (meth)acrylate, γ-propyl di($C_1$–$C_6$)alkyl ($C_1$–$C_6$)alkoxysilyl (meth)acrylate, vinyl tri($C_1$–$C_6$) alkoxysilyl (meth)acrylate, vinyl di($C_1$–$C_6$)alkoxy($C_1$–$C_6$) alkylsilyl (meth)acrylate, vinyl ($C_1$–$C_6$)alkoxydi($C_1$–$C_6$) alkylsilyl (meth)acrylate, vinyl tri($C_1$–$C_6$)alkylsilyl (meth) acrylate, and mixtures thereof.

The vinylaromatic monomers useful as unsaturated monomers in the present invention include, but are not limited to: styrene ("STY"), α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$–$C_{10}$)alkoxy, halo($C_1$–$C_{10}$) alkyl, carb($C_1$–$C_{10}$)alkoxy, carboxy, amino, ($C_1$–$C_{10}$) alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl ($C_1$–$C_8$) substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride and vinylidene bromide.

The antireflective porogens of the present invention may further include as polymerized units one or more fluorinated monomers, one or more fluorinated cross-linkers or a mixture thereof. Such fluorinated components are particularly suitable for antireflective compositions useful with photoresists for imaging at 157 nm. Preferably, the fluorinated monomers or cross-linkers are highly fluorinated. Any monomer containing a fluoroalkyl group, such as trifluoromethyl, is particularly suitable. Suitable fluorinated monomers include, but are not limited to fluorinated (meth) acrylates and (meth)acrylamides such as fluoroalkyl (meth) acrylate such as fluoro($C_1$–$C_{20}$)alkyl (meth)acrylate, fluoro-cycloalkyl (meth)acrylate, fluoroalkylsulfoamidoethyl (meth)acrylate, fluoroalkylamidoethyl (meth)acrylate, fluoroalkyl (meth)acrylamide, fluoroalkylpropyl (meth)acrylate, fluoroalkylethyl poly(alkyleneoxide) (meth)acrylate, fluoroalkylsulfoethyl (meth)acrylate, $\alpha H, \alpha H, \omega H, \omega H$-perfluoroalkanediol di(meth)acrylate and β-substituted fluoroalkyl (meth)acrylate; fluorinated vinyl ethers such as fluoroalkylethyl vinyl ether and fluoroalkylethyl poly (ethyleneoxide) vinyl ether; fluorinatedalcohol vinyl ethers; fluorinated vinyl acetates; fluorinatedalkyl vinyl acetates such as trifluoromethyl vinyl acetate; fluorinated aromatics such as fluorostyrene, pentafluoro styrene and fluoroalkyl styrene; fluorinated hydroxyaromatics such as fluorinated hydroxystyrene; fluorinated ethylene such as vinylidene fluoride, trifluoroethylene and tetrafluoroethylene; fluorinated α-olefins; fluorinated dienes such as perfluorobutadiene and 1-fluoroalkylperfluorobutadiene, fluorinated heterocycles such as perfluoro-(2,2-dimethyl-1,3-dioxole) and perfluoro-(2-methylene-4-methyl-1,3-dioxolane). Preferred fluorinated monomers include 3-fluorostyrene, 4-fluorostyrene, perfluorooctylethyl (meth)acrylate, perfluorooctylethyl (meth)acrylate, octafluoropentyl (meth) acrylate, trifluoroethyl (meth)acrylate, tetrafluoropropyl (meth)acrylate, vinylidene fluoride, trifluoroethylene, tetrafluoroethylene, perfluoro-(2,2-dimethyl-1,3-dioxole) and perfluoro-(2-methylene-4-methyl-1,3-dioxolane).

It will be appreciated that oligomers may be used in preparing the present antireflective porogens. Thus, for use with photoresists for imaging at sub-200 nm wavelength radiation, fluorinated oligomers may suitable be employed. Suitable fluorinated oligomers are disclosed in published PCT Patent Application WO 00/17712. Suitable oligomers include those prepared from the following monomer combinations: TFE/norbornene, TFE/nonbornene carboxylic acid, TFE/norbonene/nonbornene carboxylic acid, TFE/nonbornene/acrylic acid, TFE/nonbornene/ethylene, TFE/nonbornene/methacrylic acid, TFE/nonbornene/tert-butyl acrylate, TFE/nonbornene/tert-butyl acrylate/acrylic acid, TFE/nonbornene/tert-butyl acrylate/methacrylic acid, TFE/nonbornene/vinyl acetate, TFE/nonbornene/vinyl alcohol, TFE/nonbornene/5-norbornene-2-carboxylic acid tert-butyl ester, TFE/1-adamantane-carboxylate vinyl ester, TFE/adamantanemethylvinyl ether and TFE/norbornanemethylvinyl ether.

The polymers useful as antireflective porogens in the present invention may be prepared by a variety of polymerization techniques, such as solution polymerization or emulsion polymerization, and preferably by solution polymerization. The solution polymers useful in the present invention may be linear, branched or grafted and may be copolymers or homopolymers. Particularly suitable solution polymers include cross-linked copolymers.

The solution polymers of the present invention are generally prepared in a non-aqueous solvent. Suitable solvents for such polymerizations are well known to those skilled in the art. Examples of such solvents include, but are not limited to: hydrocarbons, such as alkanes, fluorinated hydrocarbons, and aromatic hydrocarbons, ethers, ketones, esters, alcohols and mixtures thereof. Particularly suitable solvents include dodecane, mesitylene, xylenes, diphenyl ether, gamma-butyrolactone, ethyl lactate, propyleneglycol monomethyl ether acetate, caprolactone, 2-hepatanone, methylisobutyl ketone, diisobutylketone, propyleneglycol monomethyl ether, decanol, and t-butanol.

The porogens of the present invention may be prepared by a variety of methods known in the literature. The solution antireflective porogens of the present invention may be prepared by a variety of methods, such as those disclosed in U.S. Pat. No. 5,863,996 (Graham) and U.S. patent application Ser. No. 09/460,326, both of which are hereby incorporated by reference to the extent they teach the preparation of such polymers. The emulsion polymers useful in the present invention are generally prepared the methods described in U.S. patent application Ser. No. 09/460,326, described above.

It is preferred that the polymers of the present invention are prepared using anionic polymerization or free radical polymerization techniques. It is also preferred that the polymers useful in the present invention are not prepared by step-growth polymerization processes.

The antireflective porogens of the present invention are preferably cross-linked. Any amount of cross-linker is suitable for use in the present invention. Typically, the antireflective porogens of the present invention contain at least 1% by weight, based on the weight of the porogen, of cross-linker. Up to and including 100% cross-linking agent, based on the weight of the porogen, may be effectively used in the particles of the present invention. It is preferred that the amount of cross-linker is from about 1% to about 80%, and more preferably from about 1% to about 60%. It will be appreciated by those skilled in the art that as the amount of cross-linker in the porogen increases, the conditions for removal of the porogen from the dielectric matrix may change.

Suitable cross-linkers useful in the present invention include di-, tri-, tetra-, or higher multi-functional ethylenically unsaturated monomers. Examples of cross-linkers useful in the present invention include, but are not limited to: trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, and mixtures thereof. Silyl containing monomers that are capable of undergoing cross-linking may also be used as cross-linkers, such as, but not limited to, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), tetraallylsilane, 1,3-dimethyl tetravinyldisiloxane, 1,3-divinyl tetramethyldisiloxane and mixtures thereof.

The antireflective porogens of the present invention may be directly added to the B-staged organo polysilica dielectric matrix material as is or may be first purified to remove impurities that might effect the electrical or physical properties of electronic devices. Purification of the antireflective porogens may be accomplished either by precipitation of the porogens or adsorption of the impurities.

Antireflective porogen particles of the present invention typically have a weight average molecular weight in the range of 5,000 to 1,000,000, preferably in the range of 10,000 to 500,000 and more preferably in the range of 10,000 to 100,000. The antireflective porogen particles typically have a particle size up to about 1,000 nm, such as in the range of 0.5 to 1000 nm. It is preferred that the particle size is in the range of about 0.5 to about 200 nm, more preferably from about 0.5 about 50 nm, and most preferably from about 1 nm to about 20 nm. The particle size polydispersity of these antireflective porogen particles is in the range 1 to 20 and more preferably in the range of 1.001 to 15 and most preferably in the range of 1.001 to 10.

Suitable block copolymers having labile components useful as removable porogens are those disclosed in U.S. Pat. Nos. 5,776,990 and 6,093,636. The incorporation of one or more chromophores into such block copolymers provides an antireflective porogen useful in the present invention. Block copolymers containing such chromophore containing moieties may be prepared by a variety of means known in the art.

The present antireflective porogens are typically cross-linked polymer particles and have a molecular weight or particle size suitable for use as a modifier in advanced interconnect structures in electronic devices. Typically, the useful particle size range for such applications is up to about 1,000 nm, such as that having a mean particle size in the range of about 0.5 to about 1000 nm. It is preferred that the mean particle size is in the range of about 0.5 to about 200 mn, more preferably from about 0.5 to about 50 nm, and most preferably from about 1 nm to about 20 nm. An advantage of the present process is that the size of the pores formed in the dielectric matrix are substantially the same size, i.e., dimension, as the size of the removed porogen particles used. Thus, the porous dielectric material made by the process of the present invention has substantially uniformly dispersed pores with substantially uniform pore sizes having a mean pore size in the range of from 0.5 to 1000 nm, preferably 0.5 to 200 nm, more preferably 0.5 and 50 nm and most preferably 1 to 20 nm.

To be useful in forming porous dielectric materials, the antireflective porogens of the present invention must be at least partially removable under conditions which do not adversely affect the dielectric matrix material, preferably substantially removable, and more preferably completely removable. Any procedures or conditions which at least partially remove the porogen without substantially adversely affecting the dielectric matrix material may be used. It is preferred that less than 5% of the dielectric matrix is degraded or otherwise affected by the porogen removal process. It is further preferred that the porogen is substantially removed, i.e. that less than about 20% by weight of the porogen remains. Typical methods of removal include, but are not limited to: exposure to heat, pressure, vacuum or radiation such as, but not limited to, actinic, infrared ("IR"), microwave, UV, x-ray, gamma ray, alpha particles, neutron beam or electron beam. It will be appreciated that more than one method of removing the porogen or polymer may be used, such as a combination of heat and actinic radiation. It is preferred that the matrix material is exposed to heat or UV light to remove the porogen. It will also be appreciated by those skilled in the art that other methods of porogen removal, such as by atom abstraction, may be employed.

The porogens of the present invention can be thermally removed under vacuum, nitrogen, argon, mixtures of nitrogen and hydrogen, such as forming gas, or other inert or reducing atmosphere. The porogens of the present invention may be removed at any temperature that is higher than the thermal curing temperature and lower than the thermal decomposition temperature of the dielectric matrix material. Typically, the porogens of the present invention may be removed at temperatures in the range of 150° to 450° C. and preferably in the range of 250° to 425° C. Typically, the porogens of the present invention are removed upon heating for a period of time in the range of 1 to 120 minutes. After removal from the dielectric matrix material, 0 to 20% by weight of the porogen typically remains in the porous dielectric material.

In one embodiment, when a porogen of the present invention is removed by exposure to radiation, the porogen polymer is typically exposed under an inert atmosphere, such as nitrogen, to a radiation source, such as, but not limited to, visible or ultraviolet light. While not intending to be bound by theory, it is believed that porogen fragments form, such as by radical decomposition, and are removed from the matrix material under a flow of inert gas. The energy flux of the radiation must be sufficiently high such that porogen particles are at least partially removed.

In preparing the dielectric matrix compositions of the present invention, the antireflective porogens described above are first dispersed within, or dissolved in, a B-staged organo polysilica dielectric material. Any amount of antireflective porogen may be combined with the B-staged organo polysilica dielectric materials according to the present invention. The amount of porogen used will depend on the particular porogen employed, the particular B-staged organo polysilica dielectric material employed, the extent of dielectric constant reduction desired in the resulting porous dielectric material, and the extent of antireflective character desired. Typically, the amount of antireflective porogen used is in the range of from 1 to 90 wt %, based on the weight of the B-staged organo polysilica dielectric material, preferably from 10 to 80 wt %, and more preferably from 15 to 60 wt %. A particularly useful amount of porogen is in the range of form about 1 to about 60 wt %.

The higher the amount of antireflective porogen employed, the higher the resulting pore density in the porous dielectric material as well as the more antireflective the dielectric layer. It will be appreciated by those skilled in the art that lesser amounts of antireflective porogen may be employed, particularly when a thin layer of antireflective coating is to be applied to the dielectric material.

The antireflective porogens of the present invention may be combined with the B-staged organo polysilica dielectric material by any methods known in the art. Typically, the B-staged matrix material is first dissolved in a suitable high boiling solvent, such as, but not limited to, methyl isobutyl ketone, diisobutyl ketone, 2-heptanone, γ-butyrolactone, ε-caprolactone, ethyl lactate propyleneglycol monomethyl ether acetate, propyleneglycol monomethyl ether, diphenyl ether, anisole, n-amyl acetate, n-butyl acetate, cyclohexanone, N-methyl-2-pyrrolidone, N,N'-dimethylpropyleneurea, mesitylene, xylenes, or mixtures thereof, to form a solution. The antireflective porogens are then dispersed or dissolved within the solution. The resulting dispersion or solution is then deposited on a substrate by methods known in the art, such as spin coating, spray coating or doctor blading, to form a film or layer.

After being deposited on a substrate, the B-staged organo polysilica dielectric material is then substantially cured to form a rigid, cross-linked organo polysilica dielectric matrix material without substantially removing the antireflective porogen. The curing of the organo polysilica dielectric material may be by any means known in the art including, but not limited to, heating to induce condensation or e-beam irradiation to facilitate free radical coupling of the oligomer or monomer units. Typically, the B-staged material is cured by heating at an elevated temperature, e.g. either directly, e.g. heated at a constant temperature such as on a hot plate, or in a step-wise manner. Typically, the organo polysilica containing antireflective porogens is first annealed at a temperature of from about 200° to about 350° C., and then heated to a higher temperature, such as from about 400° to about 450° C. to at least partially remove the porogens. Such curing conditions are known to those skilled in the art. In conventional processes, the porogen is next removed to form a porous organo polysilica dielectric material.

Accordingly, the present invention is directed to a method of preparing porous organo polysilica dielectric materials including the steps of: a) disposing removable porogen in a B-staged organo polysilica dielectric material; b) curing the B-staged organo polysilica dielectric material to form an organo polysilica dielectric matrix material without substantially degrading the porogen; and c) subjecting the organo polysilica dielectric matrix material to conditions which at least partially remove the porogen to form a porous organo polysilica dielectric material without substantially degrading the organo polysilica dielectric material; wherein the porogen includes one or more chromophores.

The porous organo polysilica dielectric material made by the process of the present invention is suitable for use in any application where a low refractive index or low dielectric material may be used. When the porous dielectric material of the present invention is a thin film, it is useful as insulators, anti-reflective coatings, sound barriers, thermal breaks, insulation, optical coatings and the like. The porous organo polysilica dielectric materials of the present invention are preferably useful in electronic and optoelectronic devices including, but not limited to, the fabrication of multilevel integrated circuits, e.g. microprocessors, digital signal processors, memory chips and band pass filters, thereby increasing their performance and reducing their cost.

The porous organo polysilica dielectric matrix materials of the present invention are particularly suitable for use electronic device manufacture, such as in integrated circuit manufacture. Thus, the present invention provides a method of manufacturing an electronic device including the steps of; a) disposing on the substrate a B-staged organo polysilica dielectric material including porogen; b) curing the B-staged organo polysilica dielectric material to form an organo polysilica dielectric matrix material without substantially degrading the porogen; and c) thereafter subjecting the organo polysilica dielectric matrix material to conditions which at least partially remove the porogen to form a porous organo polysilica dielectric material without substantially degrading the organo polysilica dielectric material; wherein the porogen includes one or more chromophores.

If the antireflective porogens are removed prior to the imaging step, their antireflective purpose will not be achieved. Thus, according to a preferred embodiment present invention, the antireflective porogens are removed after the dielectric layer has been imaged. Thus, the present invention provides a method of manufacturing an electronic device including the steps of: a) disposing on the substrate a B-staged organo polysilica dielectric material including porogen; b) curing the B-staged organo polysilica dielectric material to form an organo polysilica dielectric matrix material without substantially degrading the porogen; c) disposing a photoresist on the organo polysilica dielectric matrix material; d) exposing or patterning the photoresist; and e) thereafter subjecting the organo polysilica dielectric matrix material to conditions which at least partially remove the porogen to form a porous organo polysilica dielectric material without substantially degrading the organo polysilica dielectric material; wherein the porogen includes one or more chromophores.

Following transfer of the image to the dielectric layer, the photoresist is typically removed or stripped. The antireflective porogens may be removed from the dielectric matrix material during this stripping step or during any step thereafter. It is preferred that the antireflective porogen is not removed from the dielectric material until after a first metal layer has been deposited. Such metal layers are typically deposited following etching of apertures (recessed features) such as vias and trenches. Such metal layers may include one or more barrier layers, seed layers and metallization layers. "Metallization layer" refers to the metal layer that substantially or completely fills the apertures, i.e. an aperture fill layer. Typically, the first metal layer is a barrier layer or a seed layer. When the apertures are to be filled with copper, a barrier layer is typically applied, such as by chemical vapor deposition ("CVD") or physical vapor deposition ("PVD"). Barrier layers are typically used with copper to prevent migration of copper into the dielectric material and are typically thin as compared to the metallization layer. Such barrier layers may be conductive, semi-conductive or non-conductive. Suitable barrier layers include, but are not limited to, one or more of tantalum, tantalum nitride, tantalum nitride silicide, titanium, titanium nitride, tungsten, tungsten nitride and tungsten nitride silicide. More than one barrier layer may be used, such as titanium followed by titanium nitride and optionally followed by titanium nitride silicide. Such barrier layers may be discrete layers or they may be graduated, such as, for example, going from titanium on the bottom through a titanium sub-stoichiometric nitride to a titanium stoichiometric nitride upper layer. It is preferred that a barrier layer is present.

Seed layers, when used, may be applied to the dielectric material as the first metal layer or applied to a previously deposited barrier layer. Suitable seed layers include copper or copper alloys. When a seed layer is used without a barrier layer, it is preferred that the seed layer is not copper. Such seed layers may also be deposited by CVD or PVD and are thin as compared to metallization layers. Alternatively, seed layers may be applied electrolessly. Thus, seed layers include catalysts for electroless plating.

Following such barrier and/or seed layer deposition, the aperture may be metallized or filled, such as with copper or copper alloy. Such metallization may be by any means, but is preferably at least partially electrolytic, and more preferably electrolytic. Methods of metallizing such apertures are well known to those skilled in the art. For example, ULTRAFILL™ 2001 EP copper deposition chemistries, available from Shipley Company (Marlborough, Mass.), may be used for electrolytic copper metallization of apertures.

In the alternative, the apertures may be metallized or filled electrolessly without the need for barrier or seed layers. If apertures are electrolessly metallized with copper, a barrier layer is preferred.

The deposited metal layer is typically planarized. While each deposited metal layer may be planarized, it is preferred from ease of processing that the aperture fill metal layer is planarized. It is still further preferred that the antireflective porogens are removed from the dielectric material after one or more metal layers are deposited. Once at least one metal layer is deposited, the dielectric material is subjected to conditions which at least partially remove the porogen without substantially degrading the dielectric material, where such conditions are described above.

Upon removal of the antireflective porogen, a porous dielectric material having voids is obtained, where the size of the voids is preferably substantially the same as the particle size of the porogen. The resulting dielectric material having voids thus has a lower dielectric constant than such material without such voids.

Removing the porogen after planarization, preferably after planarization of the aperture fill metal layer, allows for easier removal of the porogen components from the dielectric matrix. It is further preferred that the antireflective porogen is removed from the dielectric material after planarization of the first metal layer and preferably after planarization of the metallization layer. Thus, the present invention provides a method for producing an electronic device including the steps of: a) disposing on a substrate surface a B-staged organo polysilica dielectric matrix composition including a removable porogen, wherein the porogen includes one or more chromophore containing moieties; b) curing the B-staged dielectric matrix composition to form a dielectric matrix material without substantially removing the porogen; c) patterning the dielectric matrix material; d) depositing at least one of a barrier layer or seed layer on the surface of the dielectric material; e) depositing an aperture fill metal layer; f) planarizing the aperture fill metal layer; and g) subjecting the dielectric matrix material to conditions which at least partially remove the porogen to form a porous dielectric material layer without substantially degrading the dielectric material.

Electronic devices including a layer of organo polysilica dielectric material containing removable porogens, wherein the removable porogens include one or more chromophore containing moieties, are also provided by the present invention.

An advantage of the present invention is that electronic devices may be prepared with reduced amounts of separately applied antireflective coatings or the use of such coatings may be eliminated. Thus, the present invention provides a method of manufacturing an electronic device including the step of forming a relief image on an organo polysilica dielectric material, wherein the relief image is formed without the use of an antireflective coating layer. Such reduction in the amount of antireflective coating used reduces the total processing time, reduces the amount of organic solvent (i.e. volatile organic component or VOC) used, and reduces the cost of manufacturing. The elimination of antireflective coatings reduces the overall number of process steps used in electronic device manufacture.

It will be appreciated by those skilled in the art that multiple layers of dielectric material, including multiple layers of organo polysilica dielectric material, and metal layers may subsequently be applied by repeating the above steps. It will be further appreciated by those skilled in the art that the compositions of the present invention are useful in any and all methods of integrated circuit manufacture.

Although the above invention has been described with respect to antireflective porogens for organo polysilica dielectric materials, it will be appreciated by those skilled in the art that such antireflective porogens may suitable be used to prepare antireflective dielectric materials derived from hydridosilsesquioxane. Thus, the present invention provides a composition including a B-staged hydridosilsesquioxane dielectric material and a porogen, wherein the porogen includes one or more chromophores. The present invention further provides a method of manufacturing an electronic device including the steps of; a) disposing on the substrate a B-staged hydridosilsesquioxane dielectric material including porogen; b) curing the B-staged hydridosilsesquioxane dielectric material to form an organo polysilica dielectric matrix material without substantially degrading the porogen; and c) thereafter subjecting the organo polysilica dielectric matrix material to conditions which at least partially remove the porogen to form a porous hydridosilsesquioxane dielectric material without substantially degrading the hydridosilsesquioxane dielectric material; wherein the porogen includes one or more chromophores. Preferably, the antireflective porogen is removed after the photoresist is exposed or patterned. In such process, the use of a separate antireflective coating layer is greatly reduced or eliminated.

The following examples are presented to illustrate further various aspects of the present invention, but are not intended to limit the scope of the invention in any aspect.

EXAMPLE 1

A number of polymeric porogen samples having one or more chromophores for a variety of wavelengths, such as 248 nm, 193 nm and 157 nm were prepared. These samples were combined with a variety of commercially available methyl silsesquioxanes ("MeSQ") with varying molecular weights. The various commercial MeSQ samples tested are reported in Table 1. MeSQ samples A and B are only methylsilsesquioxane and Sample C is a methylphenylsilsesquioxane. The porogen samples are reported in Table 2 as the monomers used to prepare the porogen sample along with the monomer weight ratio, based on the total weight of the monomers used. The porogens were combined with the MeSQ matrices at different loadings of porogen and such loading levels are reported in Table 2 in percent by weight.

TABLE 1

| MeSQ Matrix | Molecular Weight | Hydroxy Content |
|---|---|---|
| A | High | Low |
| B | Low | High |
| C | Medium | Medium |

TABLE 2

| Sample | Porogen | MeSQ Sample | Porogen % |
|---|---|---|---|
| 1 | BA/MAPS/TMPTMA (18/72/10) | A | 50 |
|  | " | A/C (9:1) | 50 |
| 2 | BA/MAPS/TMPTMA (45/45/10) | A | 50 |
|  | " | B | 50 |
| 3 | BA/MAPS/TMPTMA (72/18/10) | A | 50 |
|  | " | B | 50 |
|  | " | C | 50 |
|  | " | C | 30 |
| 4 | BA/HPMA/MAPS/TMPTMA (15/60/15/10) | A | 50 |
|  | " | A | 30 |
|  | " | A/C (9:1) | 50 |
|  | " | B | 50 |
|  | " | C | 50 |
|  | " | C | 30 |
| 5 | BA/HPMA/MAPS/TMPTMA (60/15/15/10) | A | 50 |
|  | " | A/C (9:1) | 30 |
|  | " |  | 50 |
|  | " | B | 50 |
|  | " | C | 50 |
| 6 | BA/HPMA/MAPS/TMPTMA (15/15/60/10) | A | 50 |
|  | " | A/C (9:1) | 50 |
|  | " | B | 50 |
| 7 | BA/VTMOS/DVB (80/10/10) | C | 50 |
|  | " | A/C (9:1) | 50 |
|  | " | B | 50 |
| 8 | BA/VTMOS/DVB (85/5/10) | C | 50 |
|  | " | A/C (9:1) | 50 |
|  | " | B | 50 |
| 9 | PPGMEA260/VTMOS/DVB (80/10/10) | C | 50 |
|  | " | A/C (9:1) | 50 |
|  | " | B | 50 |
|  | " | A | 30 |
| 10 | PEGMEMA475/VTMOS/DVB (80/10/10) | C | 50 |
|  | " | A/C (9:1) | 30 |
|  | " | A/C (9:1) | 50 |
|  | " | B | 50 |
|  | " | A | 30 |
| 11 | PPGMEA260/VTMS/DVB (80/10/10) | C | 50 |
|  | " | C | 30 |
|  | " | A/C (9:1) | 50 |
|  | " | B | 50 |
|  | " | A | 30 |
| 12 | BA/VTMS/TMPTMA (80/10/10) | C | 50 |
|  | " | C | 30 |
|  | " | A/C (9:1) | 50 |
| 13 | ANTMA/HEMA/MMA/TMPTMA (37.7/24.2/31.1/7) | — | — |
| 14 | ANTMA/HEMA/MMA/TMPTMA (38.5/24.8/31.7/5) | — | — |

EXAMPLE 2

Porous dielectric films are prepared using polymer porogens of the present invention. A sample is prepared by combining MeSQ matrix C (0.0265 g) and MeSQ matrix A (0.21 g) with an antireflective porogen having as polymerized units ANTMA/PEGMEMA475/VTMOS/TMPTMA (35/33/25/7) in propylene glycol methyl ether acetate. The antireflective porogen is loaded into the MeSQ sample at 50% by weight. The sample is disposed on a silicon wafer as a thin coating using spin casting to a thickness of about 1.3 μm). The thickness is controlled by the duration and spin rate of spread cycle, drying cycle and final spin cycle. The wafer is then processed at 150° C. for 1 minute and is then heated in a PYREX™ container in an oven to 200° C. under an argon atmosphere for 30 minutes. A photoresist, UV6 (available from Shipley Company, Marlborough, Mass.), is coated on the cured dielectric material containing the antireflective porogen. The photoresist is then exposed though a photomask at 248 nm. The photoresist is developed, the dielectric material is etched and the remaining photoresist is then removed. The wafer is then placed in a furnace at 200° C. and the furnace is then heated at a rate of 10° C. per minute to a temperature of 420° C. and is then held at this temperature for 60 minutes. The decomposition of the polymer particle was accomplished at this temperature.

EXAMPLE 3

The procedure of Example 2 is repeated except that the antireflective porogen is HA/MMA/VTMOS/TMPTMA (45/20/10/25).

What is claimed is:

1. A plurality of polymer particles suitable for use as porogens comprising as polymerized units one or more monomers of formula (I)

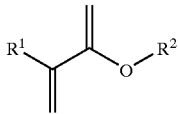
(I)

wherein $R^1$ is H or $CH_3$; and $R^2$ is selected from phenyl, benzyl,

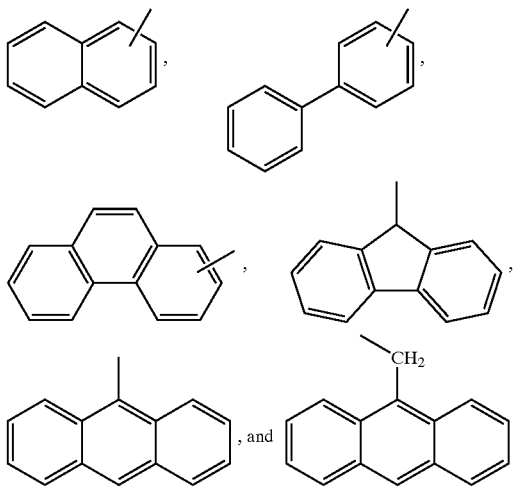

and one or more cross-linking agents, wherein the plurality of polymer particles has a mean particle size of 0.5 to 200 nm.

2. The plurality of polymer particles of claim 1 further comprising as polymerized units one or more monomers selected from the group consisting of silyl containing monomers and poly(alkylene oxide) monomers.

3. The plurality of polymer particles of claim 2 wherein the silyl containing monomer is selected from the group consisting of vinyltrimethylsilane, vinyltrimethylsilane, vinyltrimethoxysilane, vinyltriethoxysilane, γ-trimethoxysilylpropyl (meth)acrylate, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisoxane, poly(methylvinylsiloxane), poly(vinylhydrosiloxane), poly(phenylvinylsiloxane), allyloxy-tert-butyldimethylsilane, allyloxytrimethylsilane, allyltriethoxysilane, allyltri-iso-propylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis (trimethylsilyloxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane and mixtures thereof.

4. The plurality of polymer particles of claim 2, wherein the poly(alkylene oxide) monomer is selected from the group consisting of poly(propylene oxide) monomers, poly(ethylene oxide) monomers, poly(ethylene oxide/propylene oxide) monomers, poly(propylene glycol) (meth)acrylates, poly(propylene glycol) alkyl ether (meth)acrylates, poly(propylene glycol) phenyl ether (meth)acrylates, poly(propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylene/ethylene glycol) alkyl ether (meth)acrylates and mixtures thereof.

5. The plurality of polymer particles of claim 1 further comprising as polymerized units one or more fluorinated monomers.

6. A plurality of polymer particles suitable for use as porogens comprising as polymerized units one or more cross-linking agents and one or more monomers containing a chromophore selected from the group consisting of naphthyl, substituted naphthyl, anthracenyl, substituted anthracenyl, phenanthryl, substituted phenanthryl, phenyl, and substituted phenyl wherein the plurality of polymer particles has a mean particle size of 1 to 20 nm.

7. The plurality of polymer particles of claim 6, wherein the one or more monomers containing a chromophore are monomers of formula (I)

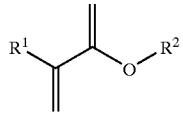
(I)

wherein $R^1$ is H or $CH_3$; and $R^2$ is selected from phenyl, benzyl,

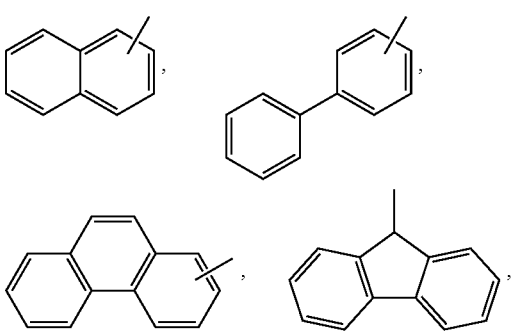

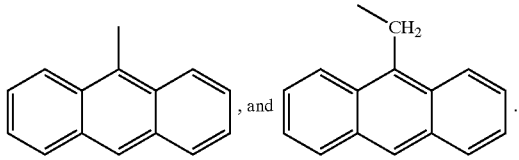

8. The plurality of polymer particles of claim 6 further comprising as polymerized units one or more monomers selected from the group consisting of (meth)acrylic acid, (meth)acrylamindes, alkyl (meth)acrylates, alkenyl (meth)acrylates, aromatic (meth)acrylates, vinyl aromatic monomers, nitrogen-containing compounds, substituted ethylene monomers and fluorinated monomers.

9. The plurality of polymer particles of claim 6 further comprising as polymerized units one or more monomers selected from the group consisting of silyl containing monomers and poly(alkylene oxide) monomers.

10. The plurality of polymer particles of claim 9 wherein the silyl containing monomer is selected from the group consisting of vinyltrimethylsilane, vinyltriethylsilane, vinyltrimethoxysilane, vinyltriethoxysilane, γ-trimethoxysilylpropyl (meth)acrylate, divinylsilane, trivinylsilane, dimethyldivinylsilane, divinylmethylsilane, methyltrivinylsilane, diphenyldivinylsilane, divinylphenylsilane, trivinylphenylsilane, divinylmethylphenylsilane, tetravinylsilane, dimethylvinyldisiloxane, poly(methylvinylsiloxane), poly(vinylhydrosiloxane), poly(phenylvinylsiloxane), allyloxy-tert-butyldimethylsilane, allyloxytrimethylsilane, allyltriethoxysilane, allyltri-iso-propylsilane, allyltrimethoxysilane, allyltrimethylsilane, allyltriphenylsilane, diethoxy methylvinylsilane, diethyl methylvinylsilane, dimethyl ethoxyvinylsilane, dimethyl phenylvinylsilane, ethoxy diphenylvinylsilane, methyl bis (trimethylsilyoxy)vinylsilane, triacetoxyvinylsilane, triethoxyvinylsilane, triethylvinylsilane, triphenylvinylsilane, tris(trimethylsilyloxy)vinylsilane, vinyloxytrimethylsilane and mixtures thereof.

11. The plurality of polymer particles of claim 9 wherein the poly(alkylene oxide) monomer is selected from the group consisting of poly(propylene oxide) monomers, poly(ethylene oxide) monomers, poly(ethylene oxide/propylene oxide) monomers, poly(propylene glycol) (meth)acrylates, poly(propylene glycol) alkyl ether (meth)acrylates, poly(propylene glycol) phenyl ether (meth)acrylates, poly(propylene glycol) 4-nonylphenol ether (meth)acrylates, poly(ethylene glycol) (meth)acrylates, poly(ethylene glycol) alkyl ether (meth)acrylates, poly(ethylene glycol) phenyl ether (meth)acrylates, poly(propylene/ethylene glycol) alkyl ether (meth)acrylates and mixtures thereof.

12. A plurality of cross-linked polymer particles suitable for use as porogens comprising as polymerized units one or more monomers selected from the group consisting of (meth)acrylic acid, (meth)acrylamides, alkyl (meth)acrylates and alkenyl (meth)acrylates and one or more monomers containing a chromophore selected from the group consisting of phenyl, substituted phenyl, naphthyl, substituted naphthyl, anthrocenyl, substituted anthrocenyl, phenanthryl and substituted phenanthryl, wherein the plurality of polymer particles has a mean particle size of 1 to 20 nm.

13. The plurality of polymer particles of claim 12 further comprising as polymerized units one or more monomers selected from the group consisting of silyl containing monomers and poly(alkylene oxide) monomers.

14. The plurality of polymer particles of claim 12 further comprising as polymerized units one or more fluorinated monomers.

* * * * *